United States Patent [19]
Dunn

[11] 4,069,462
[45] Jan. 17, 1978

[54] PHASE-LOCKED LOOPS

[75] Inventor: David Dunn, Windham, N.H.

[73] Assignee: Data General Corporation, Southboro, Mass.

[21] Appl. No.: 750,288

[22] Filed: Dec. 13, 1976

[51] Int. Cl.² .............................................. H03B 3/04
[52] U.S. Cl. ........................................ 331/11; 331/14
[58] Field of Search ........................... 331/1 A, 11, 14; 328/155; 325/421

[56] References Cited
U.S. PATENT DOCUMENTS

| 3,277,378 | 10/1966 | Heaton-Armstrong | 331/11 |
| 3,825,855 | 7/1974 | Basset et al. | 331/11 |

FOREIGN PATENT DOCUMENTS

| 259,174 | 4/1970 | U.S.S.R. | 331/11 |

*Primary Examiner*—John Kominski
*Attorney, Agent, or Firm*—Robert F. O'Connell

[57] ABSTRACT

A phase synchronizing system having a dual mode of operation for use, for example, with "modified frequency modulation" (MFM) encoded signals wherein captive range is assured by providing a first frequency locking mode of operation wherein a voltage controlled oscillator (VCO) is first locked in frequency to a reference signal and a second phase locking mode of operation wherein the VCO is subsequently locked in phase to an MFM signal independently of the frequency assumed by the latter signal.

8 Claims, 4 Drawing Figures

PHASE-LOCKED LOOPS

INTRODUCTION

This invention relates generally to phase synchronizing loop systems and, more particularly, to means utilized therein for assuring accurate locking of a signal of said loop system to the phase of an input signal thereto independently of the frequency of the input signal.

BACKGROUND OF THE INVENTION

Phase-locked loops have been known for many years and can be described broadly for use in most applications as comprising an electronic servo loop consisting of a phase detector, a low pass filter, and a voltage controlled oscillator. By controlling the phase of the oscillator output signal, the loop is capable of locking to, or synchronizing with, the phase of an incoming signal.

In one application, for example, a phase-locked loop can be utilized to provide suitable clock signals in a system for controlling the positioning of a magnetic head with respect to a magnetic media, such as a magnetic disk or drum memory storage apparatus, in a data processing system. In such an application the input signal from the data tracks of the magnetic disk, for example, may assume a plurality of frequencies which are related by a known factor such that they are fixed multiples of each other. It is desirable to generate a clock signal having a frequency which is an integral multiple of the frequencies assumed by the input signal, and such that the input signal is also always maintained in phase with the input signal no matter which one of the plurality of frequencies such input signal assumes. In such application it is desirable that a phase-locked loop responsive to the input signal be utilized to provide such a clock signal, the frequency and phase of which is always locked to that of the input signal.

In conventional phase-locked loops using voltage controlled oscillators, the frequency range centered about the initial free-running frequency of the voltage controlled oscillator over which the loop can acquire lock with an input signal is normally designated as the capture range. In assuring that the loop can capture the phase of the incoming signal, phase-locked loops of the prior art have used many different techniques to adjust the circuit operation so as to provide an appropriate capture range. For example, in many cases a potentiometer is utilized to adjust the control voltage of the voltage controlled oscillator for operation near its center frequency. In other cases tightly controlled elements, such as inductors and capacitors, and the like, are utilized to assure that the voltage controlled oscillator free-running frequency is appropriately designed to provide a suitable capture range. Other systems utilize specially designed circuitry, such as ramp generators, for sweeping the voltage controlled oscillator through a capture range, while still other circuitry uses injection locking techniques wherein the input data is injected directly into the voltage controlled oscillator circuitry via an inductor/capacitor tank circuit. In the latter case, beating the tank circuit initiates the oscillator circuit to operate at the data frequency so that the phase-locking feedback loop can then be closed to maintain a lock-in condition. A very complex structure for performing the latter operation, for example, is disclosed in U.S. Pat. No. 3,810,234, issued to M. R. Monett on May 7, 1974.

In solving the capture range problem in the prior art, the circuitry involved often necessitates the use of expensive parts and highly stable components, the selection and use of which adds to the overall complexity of design as well as to the cost of manufacture in order to achieve the desired reliability of the system. In contrast, it is desirable to provide for a phase-locked loop which achieves automatic capture but which eliminates the need for additional expensive components and complex circuitry so that the overall design is relatively simple in form and can be relatively easy and less costly to manufacture without sacrificing the reliability of performance that is desired.

BRIEF SUMMARY OF THE INVENTION

In accordance with the invention a phase-locked loop, used to produce a signal which is in phase synchronism with an input signal which may assume multiple, but integrally related, frequencies is provided with a dual mode of operation wherein frequency capture is first achieved utilizing a suitably selected frequency detector circuit and phase capture is subsequently achieved utilizing a separate, suitably selected phase detector circuit. In the initial frequency capture mode, lock-in to the frequency of a suitably selected reference signal is provided by the frequency detector circuit which is utilized as part of a closed loop so as to bring a signal derived from a voltage controlled oscillator into frequency synchronization with the reference signal, the frequency of which has a known integral relationship to the multiple frequencies of the input signal. The loop is then switched to its second mode of operation utilizing a phase detector circuit as part of the same closed loop so as to bring the phase of a signal derived from the voltage controlled oscillator signal into synchronization with the phase of the input signal independently of the frequency which the latter signal assumes. This process provides only phase synchronization so that the phase lock-up time is predictable and data storage capacity is optimized.

DESCRIPTION OF THE INVENTION

The system of the invention can be described in more detail with the help of the accompanying drawing wherein FIG. 1 shows a block diagram of a conventional phase-locked loop system of the prior art;

Figure 1:
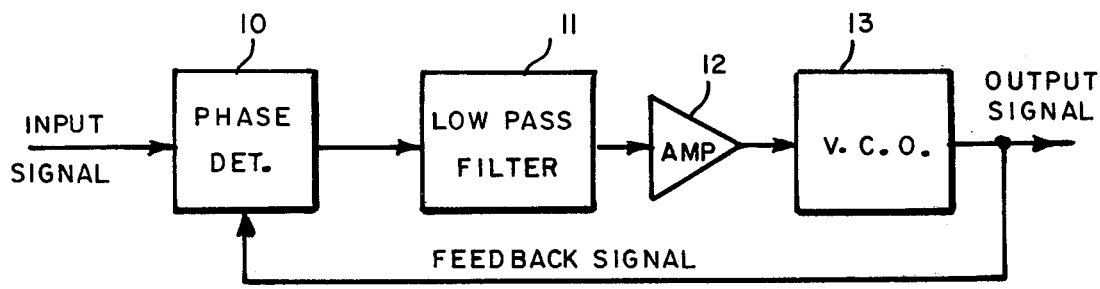

As can be seen in FIG. 1, a basic phase-locked loop is, in effect, a feedback system comprising a phase detector circuit 10 to which an input signal is supplied, together with a feedback signal, as shown. The phase detector compares the phases of the input signal and the feedback signal to produce a phase error signal at its output, which error signal is supplied to a low pass filter circuit 11. The filtered error signal is thereupon amplified by error amplifier 12 in the forward signal path, the amplified error signal then being supplied as a control voltage to a voltage controlled oscillator 13 which thereupon supplies the feedback signal to phase detector 10. The output signal from the phase-locked loop is then at the output of voltage controlled oscillator 13, such signal being locked in phase with the input signal.

Figure 2:
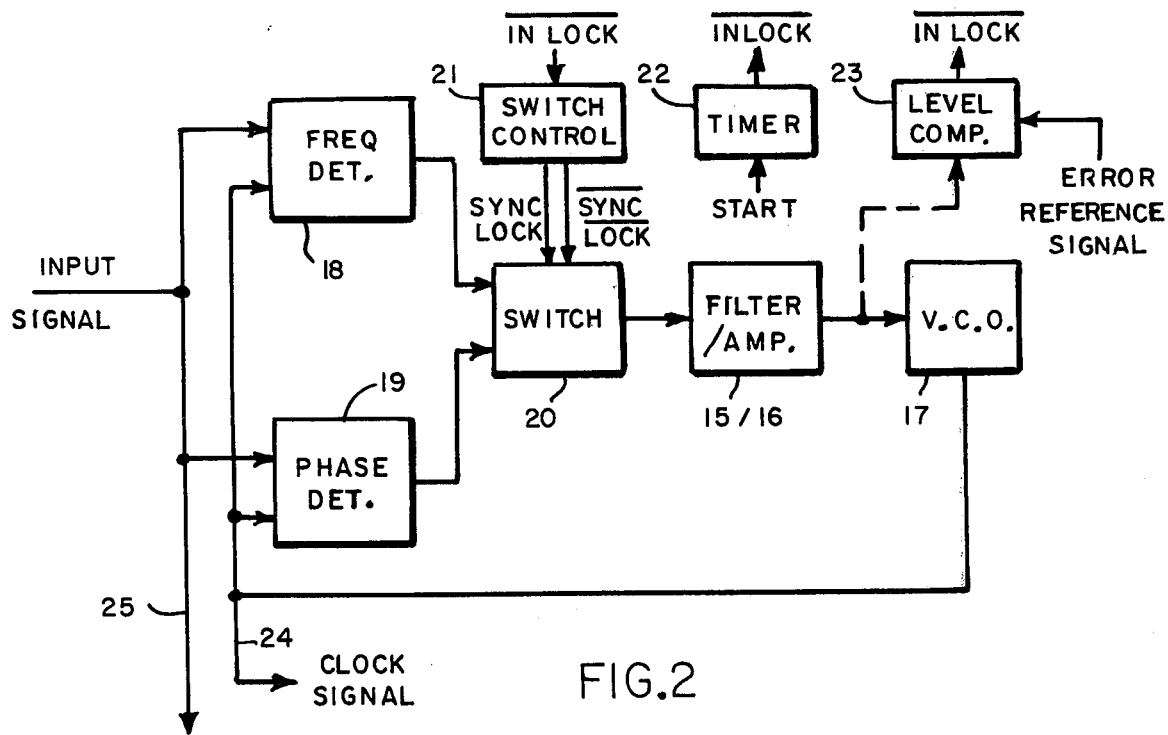
FIG. 2 shows a block diagram of a preferred embodiment of the phase-locked loop of the invention.

In accordance with the system of the invention, the basic phase-locked loop of FIG. 1 is arranged to provide operation in two modes in order to assure the generation, for example, of such a read clock signal. As can be seen in FIG. 2 a loop includes the low pass filter/amplifier combination of FIG. 1, identified by reference numerals 15/16, for supplying a control voltage to a voltage controlled oscillator 17 in the manner described above. The error input thereto, however, is supplied from one of two different detector circuits, detector 18 being a frequency detector circuit and detector 19 being a phase detector circuit. An output signal derived from voltage controlled oscillator 17 is supplied as an input to the frequency and phase detectors 18 and 19, respectively, as shown. The frequency detected and phase detected outputs from detectors 18 and 19 are supplied to appropriate switching circuitry 20 since only one of the outputs is connected to the filter/amplifier combination at a time. In the first mode of operation the switching circuit 20 operates to connect the output of frequency detector 18 to the filter/amplifier 15/16. During this mode of operation the frequency of the voltage controlled oscillator is controlled so as to bring the frequency of its output into synchronism with the frequency of a suitably selected reference signal. The frequency detection and voltage control process in such mode is a closed loop operation and will cause the voltage controlled oscillator frequency to be synchronized with that of the reference signal.

In order to understand the system of the invention it is helpful to discuss one particular application, for example, in which the invention can be used, although the invention is not limited thereto. In reading data from a storage device in a data processing system it is sometimes necessary to provide a "read clock" signal which must be locked into phase with the data input which is read from the storage device. In such systems, the data is stored in data bit cell units, a bit cell unit being defined as the length of a coded binary data pulse. In accordance with one particular coding technique, for example, the coded binary data may occur at every bit cell, at every one and one-half bit cells, or at every two bit cells, so that the frequency of the data being read varies accordingly. Such encoding technique is generally referred to in the art as "modified frequency modulation" encoding which is often alternatively referred to as "MFM" encoding or "3-frequency" encoding. In each case the read clock signal must be in phase synchronism with each of the read data input pulses independently of the frequency with which the pulses occur.

In the particular application of the invention, mentioned above, for example, when the read/write heads are first loaded onto a magnetic data storage disk preparatory to reading input data, the signal from the voltage controlled oscillator is first locked into frequency synchronism with a reference signal obtained from a system servo clock (already available in the system), which clock has a frequency having a known relationship to the multiple frequencies of the coded data which is to be read from the disk. For example, the reference signal may have a frequency corresponding to a bit cell. Such frequency lock-in operation is obtained by supplying the servo clock signal as the reference input signal to frequency detector 18, the other input to which is in effect an output signal derived from the voltage controlled oscillator. For such operation the system of the invention is in its first mode of operation as discussed above.

When such frequency lock-in condition has been achieved, the switching circuit 20 is thereupon actuated to place the loop into its second mode of operation. The frequency lock-in condition can be determined in any suitable manner so as to provide control of the switching circuitry 20 via suitable switch control circuitry 21. Thus, the loading of the read/write head on to a disk can be used to provide a START signal which actuates a timer 22 which in turn produces an $\overline{\text{IN LOCK}}$ signal after a preselected time period, which $\overline{\text{IN LOCK}}$ signal thereupon is used to cause control circuit 21 to provide for the switching operation of switching circuit 20. The time period can be selected so as to produce an $\overline{\text{IN LOCK}}$ signal at a time which is sufficiently long to assure that a frequency lock-in condition has occurred.

Alternatively, the level of the amplified error signal at the output of filter/amplifier 15/16 can be monitored and compared with the level of a suitably selected reference signal at level comparator 23 so as to produce an $\overline{\text{IN LOCK}}$ signal when the error level is below the error reference signal level, thereby assuring that a frequency lock-in condition has occurred.

When the switching operation is completed the system is placed in its second mode of operation in which the phase detector 19 is connected to the filter/amplifier 15/16 so that the frequency detector loop configuration is replaced by the phase detector loop configuration. When switching to the phase detection mode, the servo clock signal is no longer used as the input signal, the latter signal now being supplied from the data pulses being read from the magnetic disk by the read/write head. The feedback signal derived from the voltage controlled oscillator signal is supplied at a frequency which is twice that supplied during the frequency detector mode, i.e., at a frequency corresponding to that of a half-bit cell period. The voltage controlled oscillator is thereupon locked in phase to each data pulse, whether the data pulses occur every bit cell, every one and one-half bit cells, or ever two bit cells, i.e., independently of the frequency of the data which is being read.

Figure 3:
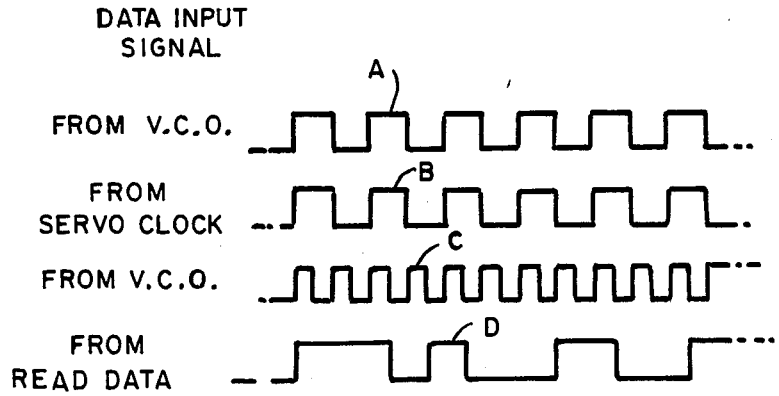
FIG. 3 shows a plurality of waveforms helpful in understanding the operation of the system of FIG. 2.

Thus, as seen in FIG. 3, during the frequency locking mode the read clock frequency signal derived from the VCO is locked into frequency and phase synchronism with the servo clock signal, as shown by the waveforms (A) and (B) of FIG. 3, respectively. During the phase locking mode, the read clock frequency signal derived from the VCO (at twice the frequency of the read clock signal derived during the frequency locking mode) is locked only in phase with the data signal which is read from the magnetic disk, the frequency of which data signal may vary, as shown by waveforms (C) and (D) of FIG. 3, respectively. If the phases of signals (C) and (D) differ, the phase detector 18 produces an error signal which is appropriately filtered and amplified to provide the required control signal for the voltage controlled oscillator to lock the signals into phase synchronization. Such phase lock condition occurs independently of the frequency of the READ DATA signal so long as the latter frequency is an integral multiple of the read clock signal, waveform (C), supplied to the phase detector from the voltage controlled oscillator.

Figure 4:
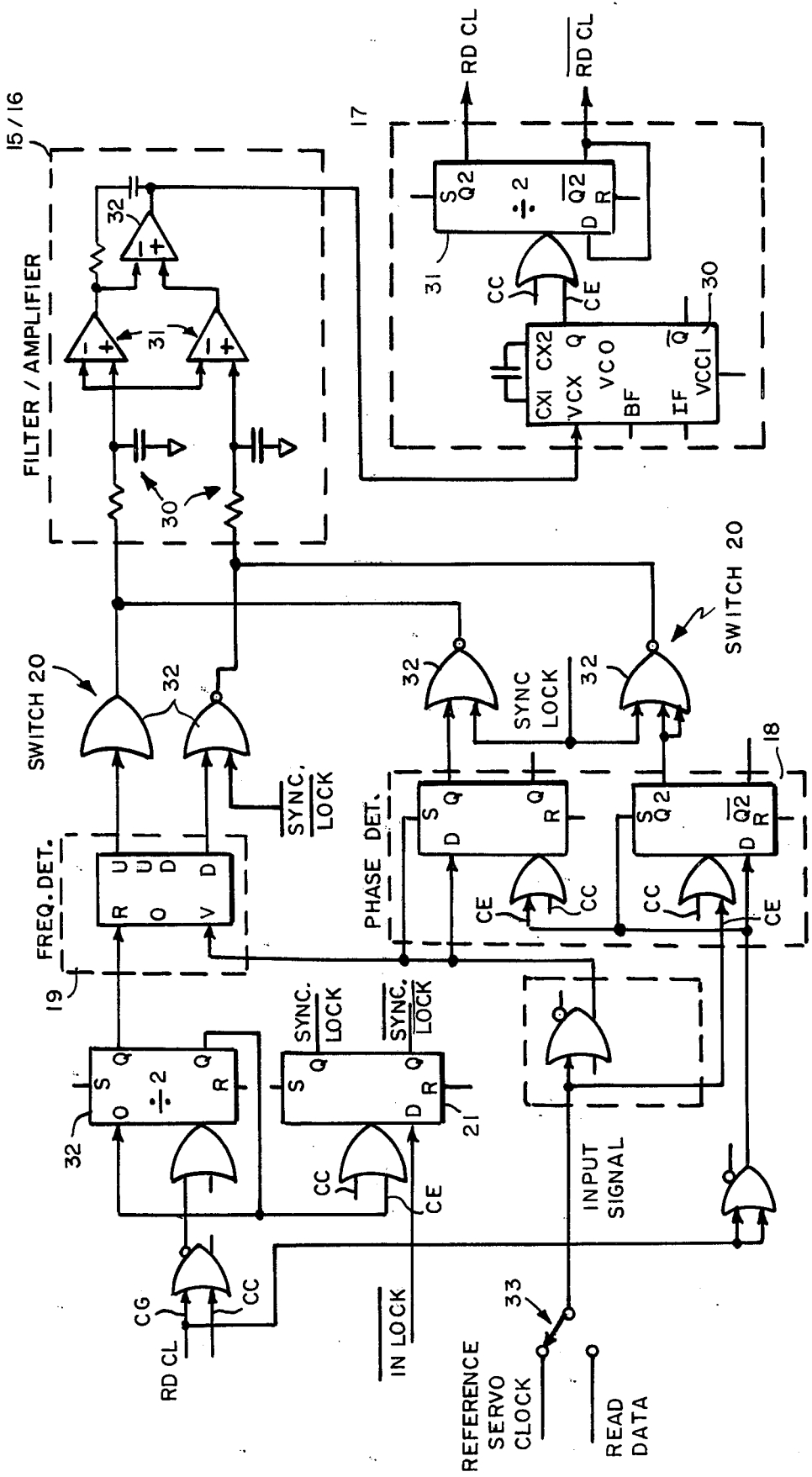
FIG. 4 shows a more detailed circuit diagram of a preferred implementation of the block diagram shown in FIG. 2.

A more detailed circuit diagram of the system of the invention is shown in FIG. 4. As can be seen therein, the filter/amplifier combination 15/16 utilizes a pair of resistance-capacitance filter circuits 30, the outputs of which are amplified in amplifiers 31 and are then combined in a differential amplifier 32, to supply either a frequency error signal or a phase error signal to the voltage controlled oscillator 17, depending on which mode of operation is being used. The latter oscillator is well known to the art and can, in one form, comprise a conventional integrated circuit, for example, which can be utilized for such purpose and is obtainable from various manufactures.

The VCO 30 supplies an output signal having a selected frequency which, in one particular exemplary embodiment which can be discussed herein, is selected as 25.8 MHz. The frequency thereof is thereupon divided by 2 in frequency divider circuitry 31 to provide a read clock signal at one-half the selected frequency, i.e., for the particular typical example being discussed, a frequency of 12.9 MHz. The output signal from the VCO and frequency divider circuitry is available both as the read clock or "RD CL" signal and the phase inverted version thereof identified as the "$\overline{\text{RD CL}}$" signal. Such frequency divider circuitry is well known to the art and in one form can also comprise integrated circuit readily available from various manufacturers.

The RD CL signal is supplied to the frequency detector circuit 19 via a frequency divider circuit 32, of the same type as that depicted by circuit 31. Thus, in the particular example being described herein, the signal supplied to the frequency detector is 6.45 MHz. The input signal supplied to the other input of frequency detector 19 during the frequency detection mode of operation of the system is obtained from a suitable system reference clock signal, identified as a servo clock signal in FIG. 4. For simplicity, such signal is shown as being supplied by a switch 33, depicted merely diagrammatically, in FIG. 4. The frequency of the reference servo clock signal is also at 6.45 MHz. Such frequency detector 19 is well known to the art and can, in one form, comprise an integrated circuit available from various manufactures.

The frequency detector 19 thereupon determines the difference between the frequency of the input signals thereto so as to produce an output signal representing such frequency difference for supply to filter/amplifier 15/16 via switch circuitry 20 which, during the frequency detection mode, operates so as to supply only the frequency difference signal from frequency detector 19 but no signal from phase detector 18. The filtered and amplified difference, or error, signal from amplifier 32 thereupon is used for the control signal for adjusting the frequency of the voltage controlled oscillator. The latter oscillator, in the specific example being discussed, has a frequency of four times the reference servo clock frequency, i.e., 25.8 MHz. Accordingly, the VCO frequency is adjusted until the frequency of the input signals to frequency detector 19 are locked in synchronism. The lock-in condition is shown in FIG. 3, for example by waveform (A) representing the 6.45 MHz period frequency signal derived from the VCO via the frequency divider circuits and waveform (B) representing the 6.45 MHz servo signal from the reference servo clock.

After a pre-set period of time determined by a suitable timer 22 (FIG. 2), following the generation of the START signal at the loading of the read/write heads, and $\overline{\text{IN LOCK}}$ signal is supplied to switch control circuit 21 which produces both a SYNC LOCK signal and a $\overline{\text{SYNC LOCK}}$ signal for controlling the operation of switch circuitry 20. During the phase detection mode when the $\overline{\text{IN LOCK}}$ signal indicates a frequency lock-in condition, the filter/amplifier 15/16 is supplied from the output of phase detector 18 via switching circuitry 20 and the output of frequency detector 19 is prevented from being supplied thereto. The switch control circuitry 21 may be in integrated circuit form using a typical D flip-flop circuit connected as shown.

As discussed above, the $\overline{\text{IN LOCK}}$ signal may be derived in an alternate manner as, for example, by comparing the level of an error reference signal with the error output signal from the filter/amplifier 15/16 so that when such level is reduced to a predetermined value below such reference, and $\overline{\text{IN LOCK}}$ signal indication is provided, as shown by level comparator 23 in FIG. 2.

During the phase detection mode of operation, the output derived from the voltage controlled oscillator 30, i.e., the RD CL signal, is supplied as one input to the phase detector 18 while the read data signal which is received from the read/write heads is supplied at the other input thereto. For such operation, switch 33 would be in the opposite position as shown. The purpose of the phase detector operation is to assure that the phase of the voltage controlled oscillator signal, i.e., the RD CL signal, always coincides with the phase of the read data signal. The latter signal, as discussed above, does not have a fixed frequency, while the former signal is arranged to have a frequency such that the period thereof is equal to one-half of a bit cell. Exemplary waveforms thereof are shown in FIG. 3 as the waveform (C) representing the RD CL signal from the VCO and the waveform (D) representing a typical read data signal. If the signals are not locked in phase synchronism, the phase detector produces an error signal via filter/amplifier 15/16 as a control voltage for the VCO in order to bring such signals into a phase-locked condition. The phase detector circuitry, as shown, comprises a pair of well-known D flip-flop circuits readily available to the art, such circuits being connected as shown at the inputs thereto to provide the phase comparison signal components supplied to filter/amplifier 15/16 via switch circuitry 20. The latter circuitry comprises well-known logic gates as depicted in FIG. 4.

Thus, when data is being read, as from a magnetic disk storage element, the phase-locked loop of the invention assures that the read clock signal is always in phase with the data signal that is so read, independently of the frequency of the latter signal. The use of a frequency detection mode locking operation prior to the data read operation always assures that the read data signal is within the capture range of the phase detection loop. Lock-in to the data signal is assured in a relatively simple manner which does not require the use of trimming potentionmeters, tightly controlled inductor or capacitance elements, or other more complex methods as suggested in the prior art for assuring capture. Once the VCO frequency is guaranteed to be within the capture range desired, as assured during the frequency detection mode, switching into the phase detection mode is simply performed utilizing components which are readily available. The overall design of such a dual mode system is much less complex than previously suggested designs and the overall cost the phase-locking operation is reduced. The design can be optimized for steady state conditions with a relatively small bandwidth so as to avoid the necessity for using large bandwidths for assuring capture, as is often required in many other systems of the prior art.

Modifications of the specific implementation of the invention as described in the embodiments above may occur to those in the art without departing from the spirit and scope of the invention. Hence, the invention is not to be construed as limited to such specific embodiments except as defined by the appended claims.

What is claimed is:

1. A system for providing in phase synchronism between a first signal and a second signal comprising
    means for comparing the frequency of a reference signal with the frequency of a feedback signal derived from said second signal to produce a first difference signal representing the frequency difference therebetween;
    filter and amplifying means;
    switching means between said frequency comparing means and said filter and amplifying means for supplying said first frequency difference signal to said filter and amplifying means, said latter means thereby providing a first control signal representing said frequency difference;
    oscillator means responsive to said first control signal for producing said second signal, the frequency of said second signal being controlled by said first control signal so that said frequency difference is minimized so that the frequency of said feedback signal derived from said second signal is in substantial synchronism with the frequency of said reference signal;
    means for comparing the phase of said second signal with the phase of said first signal to produce of second difference siganl representing the phase difference therebetween;
    means for actuating said switching means to supply said second phase difference signal to said fixed filter and amplifying means and to prevent said first frequency difference signal from being supplied thereto when said substantial frequency synchronism has been achieved, said filter and amplifying means thereby providing a second control signal;
    said oscillator means being responsive to said second control signal so that said phase difference is minimized and the phase of said second signal is in substantial in-phase synchronism with the phase of said first signal.

2. A system in accordance with claim 1 wherein said first signal has a plurality of frequencies each of which is a multiple of the frequency of said reference signal, said phase synchronism being achieved independently of the frequency of said first signal.

3. A system in accordance with claim 2 wherein said switching control means comprises a timer means selected to provide a switch control signal at a selected time period following the starting of said timing means.

4. A system in accordance with claim 3 wherein said frequency comparing means is an integrated circuit.

5. A system in accordance with claim 4 wherein said phase comparing means includes a pair of integrated circuits.

6. A system in accordance with claim 1 wherein said oscillator means comprises
    a voltage controlled oscillator for producing a signal having a first frequency;
    frequency divider means responsive to said voltage controlled oscillator signal for producing said second signal having a second frequency which is one-half that of said voltage controlled oscillator signal.

7. A system in accordance with claim 6 and further including a second frequency divider means responsive to said second signal for producing said signal derived from said second signal having a frequency which is one-fourth that of said voltage controlled oscillator signal.

8. A system in accordance with claim 7 wherein said voltage controlled oscillator is an integrated circuit.

* * * * *

UNITED STATES PATENT AND TRADEMARK OFFICE
CERTIFICATE OF CORRECTION

PATENT NO. : 4,069,462
DATED : Jan. 17, 1978
INVENTOR(S) : David Dunn

It is certified that error appears in the above-identified patent and that said Letters Patent are hereby corrected as shown below:

Column 4, line 68, change "30" to ---15A---.

Column 5, line 1, change "31" to ---16A---.

line 2, change "32" to ---16B---.

line 47, change "18" to ---19---.

line 49, change "32" to ---16B---.

Column 6, lines 3 and 19, change "18" to ---19---.

line 4, change "19" to ---18---.

In FIG. 4, change reference numeral "19" to ---18---.

change reference numeral "18" to ---19---.

change reference numeral "30" at upper right hand corner, now associated with the resistance/capacitance filter circuits, to ---15A---.

Change reference numeral "31" at upper right hand corner, now associated with amplifiers, to ---16A---.

UNITED STATES PATENT AND TRADEMARK OFFICE
CERTIFICATE OF CORRECTION

PATENT NO. : 4,069,462
DATED : Jan. 17, 1978
INVENTOR(S) : David Dunn

It is certified that error appears in the above–identified patent and that said Letters Patent are hereby corrected as shown below:

In FIG. 4, change reference numeral "32" at upper right hand corner, now associated with the differential amplifier, to ---16B---.

Delete the reference numerals "32" now associated with the gates of switch 20.

Add a reference line from reference numeral 17 to the dashed line block at the lower right hand corner.

Signed and Sealed this

Twenty-eighth Day of April 1981

[SEAL]

Attest:

RENE D. TEGTMEYER

Attesting Officer     Acting Commissioner of Patents and Trademarks

UNITED STATES PATENT AND TRADEMARK OFFICE
CERTIFICATE OF CORRECTION

PATENT NO. : 4,069,462
DATED : January 17, 1978
INVENTOR(S) : DAVID DUNN

It is certified that error appears in the above-identified patent and that said Letters Patent are hereby corrected as shown below:

Column 5, lines 25, 30, 37, 40, 47 and 55,
change "19" to --18--.

Signed and Sealed this

Eleventh Day of August 1981

[SEAL]

Attest:

Attesting Officer

GERALD J. MOSSINGHOFF
Commissioner of Patents and Trademarks